United States Patent
Kirkpatrick et al.

(10) Patent No.: US 10,627,352 B2
(45) Date of Patent: Apr. 21, 2020

(54) METHODS AND APPARATUS FOR EMPLOYING AN ACCELERATED NEUTRAL BEAM FOR IMPROVED SURFACE ANALYSIS

(75) Inventors: Sean R. Kirkpatrick, Littleton, MA (US); Allen R. Kirkpatrick, Carlisle, MA (US)

(73) Assignee: Exogenesis Corporation, Billerica, MA (US)

( * ) Notice: Subject to any disclaimer, the term of this patent is extended or adjusted under 35 U.S.C. 154(b) by 472 days.

(21) Appl. No.: 13/590,405

(22) Filed: Aug. 21, 2012

(65) Prior Publication Data

US 2013/0213933 A1 Aug. 22, 2013

Related U.S. Application Data

(60) Provisional application No. 61/526,158, filed on Aug. 22, 2011.

(51) Int. Cl.
| | |
|---|---|
| *G01N 23/00* | (2006.01) |
| *H01J 37/08* | (2006.01) |
| *H01J 37/305* | (2006.01) |
| *G01N 23/225* | (2018.01) |

(52) U.S. Cl.
CPC .............. *G01N 23/00* (2013.01); *H01J 37/08* (2013.01); *H01J 37/305* (2013.01); *G01N 23/225* (2013.01); *H01J 2237/0041* (2013.01); *H01J 2237/0812* (2013.01); *H01J 2237/3151* (2013.01)

(58) Field of Classification Search
CPC ....... G01N 23/00; G01N 23/225; H01J 37/08; H01J 37/305; H01J 2237/0041; H01J 2237/0812; H01J 2237/3151

USPC ...................................................... 204/298.36
See application file for complete search history.

(56) References Cited

U.S. PATENT DOCUMENTS

| | | | | |
|---|---|---|---|---|
| 4,361,762 A | | 11/1982 | Douglas | |
| 4,393,311 A | * | 7/1983 | Feldman | C23F 4/00 |
| | | | | 250/459.1 |
| 4,457,803 A | * | 7/1984 | Takigawa | H01J 37/302 |
| | | | | 204/192.11 |

(Continued)

FOREIGN PATENT DOCUMENTS

| | | |
|---|---|---|
| EP | 1255277 B1 | 9/2007 |
| JP | 2001-176440 | 6/2001 |

(Continued)

OTHER PUBLICATIONS

Seki et al. "Development of a 1 mA cluster ion beam source", Nuclear Instruments and Methods in Physics Research, B 237 (Jul. 2005), 455-458.*

(Continued)

*Primary Examiner* — Rodney G McDonald
(74) *Attorney, Agent, or Firm* — Burns & Levinson LLP; Jerry Cohen

(57) ABSTRACT

Apparatus and methods are disclosed for employing an accelerated neutral beam derived from an accelerated gas cluster ion beam as a physical etching beam for providing reduced material mixing at the etched surface, compared to previous techniques. This results in the ability to achieve improved depth profile resolution in measurements by analytical instruments such as SIMS and XPS (or ESCA) analytical instruments.

14 Claims, 7 Drawing Sheets

(56) References Cited

U.S. PATENT DOCUMENTS

| | | | |
|---|---|---|---|
| 5,814,194 A * | 9/1998 | Deguchi | ............ C30B 33/00 204/192.1 |
| 7,060,989 B2 | 6/2006 | Swenson et al. | |
| 2003/0127591 A1 | 7/2003 | Verdervorst | |
| 2008/0245974 A1 | 10/2008 | Kirkpatrick et al. | |
| 2010/0072173 A1 | 3/2010 | Hautala | |

FOREIGN PATENT DOCUMENTS

| | | |
|---|---|---|
| JP | 2002-116163 | 4/2002 |
| JP | 2011-086471 | 4/2011 |
| WO | 99/15884 A1 | 4/1999 |

OTHER PUBLICATIONS

Iijima, Y. et al. Low Energy Ar neutral beam etching method for x-ray photoelectron spectroscopy. Surface and Interface Analysis 21(11), Nov. 1994: 778-784.

Mahoney, C.M. Cluster Secondary Ion Mass Spectrometry of Polymers and Related Materials. Mass Spectrometry Reviews, 2010 (vol. 29): 247-293.

International Search Report and Written Opinion dated Dec. 7, 2012 for International Application No. PCT/US12/51673.

Japanese Patent Application No. 2014-527235 Office Action dated Jun. 29, 2016 based on PCT/US2012/051673.

\* cited by examiner

METHODS AND APPARATUS FOR EMPLOYING AN ACCELERATED NEUTRAL BEAM FOR IMPROVED SURFACE ANALYSIS

CROSS REFERENCE TO RELATED APPLICATIONS

This application claims priority from U.S. Provisional Patent Application No. 61/526,158, filed on Aug. 22, 2011 and incorporated herein by reference in its entirety for all purposes.

FIELD OF THE INVENTION

This invention relates generally to methods and systems for beam etching of a surface. More specifically, it relates to methods and systems etching a surface using an accelerated Neutral Beam derived from an accelerated gas cluster ion beam (GCIB). The Neutral Beam is preferably an accelerated neutral monomer beam derived from a GCIB.

BACKGROUND OF THE INVENTION

In a variety of analytical instruments, depth profiling of the constituents of a material is done by surface analysis or analysis of a thin surface region in combination with an etching process that exposes subsequent depths of material to the analysis process. For example in secondary ion mass spectrometry (SIMS) analysis, depth profiling is typically done by using an ion beam to etch away successive surface thicknesses while (or by turns) analyzing the surface elements by probing with an ion beam to produce the emission of secondary ions from the surface. The secondary ions are analyzed by mass spectrometric techniques to identify them. In another example, X-ray photoelectron spectroscopy (XPS) sometimes also called electron spectroscopy for chemical analysis (ESCA), a similar etching sequence to permit depth profiling is combined with the use of an x-ray probe beam for analysis of the exposed surface. The x-ray probe beam stimulates release of photoelectrons from the surface and shallow subsurface. The kinetic energy spectra of the photoelectrons contain information from which elemental and chemical descriptions of the material can be estimated. For all of these methods, a confounding factor is the fact that the ion beam used for etching inevitably penetrates the surface being analyzed, disturbing the surface, and displacing atoms in a way that can cause them to be detected at a depth that is not representative of the original distribution. Conventional ion beams normally use atomic or molecular ions that produce a knock-on effect that can drive target atoms much deeper into the target. They can also produce an amorphous layer in which there is general mixing of the original atoms throughout a relatively thick region.

In recent years there has been much interest and activity toward using a GCIB as the etching beam because the nature of GCIB etching results in very little knock-on and formation of a very thin amorphous mixed layer to confound the resolution of the depth measurement.

Ions have long been favored for use in many processes because their electric charge facilitates their manipulation by electrostatic and magnetic fields. This introduces great flexibility in processing. However, in some applications, the charge that is inherent to any ion (including gas cluster ions in a GCIB) may produce undesirable effects in the processed surfaces. GCIB has a distinct advantage over conventional ion beams in that a gas cluster ion with a single or small multiple charge enables the transport and control of a much larger mass-flow (a cluster may consist of hundreds or thousands of molecules) compared to a conventional ion (a single atom, molecule, or molecular fragment.) Particularly in the case of insulating materials, surfaces processed using ions often suffer from charge-induced damage resulting from abrupt discharge of accumulated charges, or production of damaging electrical field-induced stress in the material (again resulting from accumulated charges.) In many such cases, GCIBs have an advantage due to their relatively low charge per mass, but in some instances may not eliminate the target-charging problem. Furthermore, moderate to high current intensity ion beams may suffer from a significant space charge-induced defocusing of the beam that tends to inhibit transporting a well-focused beam over long distances. Again, due to their lower charge per mass relative to conventional ion beams, GCIBs have an advantage, but they do not fully eliminate the space charge transport problem.

It is therefore an object of this invention to provide a method of etching a surface that produces a reduced mixing layer to facilitate improved depth resolution when employed in an analytical instrument.

SUMMARY OF THE INVENTION

The present invention is directed to the use of an accelerated Neutral Beam derived from an accelerated GCIB for etching a surface in conjunction with a surface analysis technique to provide improved depth resolution for the analysis. Methods and apparatus for forming such Neutral Beams by first forming an accelerated charged GCIB and then neutralizing or arranging for neutralization of at least a fraction of the beam and separating the charged and uncharged fractions are disclosed herein. The Neutral Beams may consist of neutral gas Clusters, neutral monomers, or a combination of both. The use of an accelerated Neutral Beam provides a physical etching method that results in a thinner layer of material mixing at the etched surface and thus is superior over other methods for surface depth profiling in certain types of analytical instruments.

Beams of energetic conventional ions, accelerated electrically charged atoms or molecules, are widely utilized to form semiconductor device junctions, to modify surfaces by sputtering and etching, and to modify the properties of thin films. Unlike conventional ions, gas cluster ions are formed from clusters of large numbers (having a typical distribution of several hundreds to several thousands with a mean value of a few thousand) of weakly bound atoms or molecules of materials that are gaseous under conditions of standard temperature and pressure (commonly oxygen, nitrogen, or an inert gas such as argon, for example, but any condensable gas can be used to generate gas cluster ions) with each cluster sharing one or more electrical charges, and which are accelerated together through large electric potential differences (on the order of from about 3 kV to about 70 kV or more) to have high total energies. After gas cluster ions have been formed and accelerated, their charge states may be altered or become altered (even neutralized), and they may fragment or may be induced to fragment into smaller cluster ions or into monomer ions and/or neutralized smaller clusters and neutralized monomers, but they tend to retain the relatively high velocities and energies that result from having been accelerated through large electric potential differences, with the energy being distributed over the fragments. After gas cluster ions have been formed and accelerated, their charge states may be altered or become altered (even neutralized) by collisions with other cluster ions, other neutral clusters, or residual background gas particles, and thus they may fragment or may be induced to fragment into smaller cluster ions or into monomer ions and/or into neutralized smaller clusters and neutralized monomers, but the resulting cluster ions, neutral clusters, and monomer ions and neutral monomers tend to retain the relatively high velocities and energies that result from having been accelerated through large electric potential differences, with the accelerated gas cluster ion energy being distributed over the fragments.

As used herein, the terms "GCIB", "gas cluster ion beam" and "gas cluster ion" are intended to encompass not only ionized beams and ions, but also accelerated beams and ions that have had all or a portion of their charge states modified (including neutralized) following their acceleration. The terms "GCIB" and "gas cluster ion beam" are intended to encompass all beams that comprise accelerated gas cluster ions even though they may also comprise non-clustered particles. As used herein, the term "Neutral Beam" is intended to mean a beam of neutral gas clusters and/or neutral monomers derived from an accelerated gas cluster ion beam and wherein the acceleration results from acceleration of a gas cluster ion beam. As used herein, the term "monomer" refers equally to either a single atom or a single molecule. The terms "atom," "molecule," and "monomer" may be used interchangeably and all refer to the appropriate monomer that is characteristic of the gas under discussion (either a component of a cluster, a component of a cluster ion, or an atom or molecule). For example, a monatomic gas like argon may be referred to in terms of atoms, molecules, or monomers and each of those terms means a single atom. Likewise, in the case of a diatomic gas like nitrogen, it may be referred to in terms of atoms, molecules, or monomers, each term meaning a diatomic molecule. Furthermore a molecular gas like $CO_2$, may be referred to in terms of atoms, molecules, or monomers, each term meaning a three atom molecule, and so forth. These conventions are used to simplify generic discussions of gases and gas clusters or gas cluster ions independent of whether they are monatomic, diatomic, or molecular in their gaseous form.

Because the energies of individual atoms within a large gas cluster ion are very small, typically a few eV to some tens of eV, the atoms penetrate through, at most, only a few atomic layers of a target surface during impact. This shallow penetration (typically a few nanometers to about ten nanometers, depending on the beam acceleration) of the impacting atoms means all of the energy carried by the entire cluster ion is consequently dissipated in an extremely small volume in a very shallow surface layer during a time period of less than a microsecond. This differs from conventional ion beams where the penetration into the material is sometimes several hundred nanometers, producing changes and material modification deep below the surface of the material. Because of the high total energy of the gas cluster ion and extremely small interaction volume, the deposited energy density at the impact site is far greater than in the case of bombardment by conventional ions. Accordingly, GCIB etching of a surface tends to produce a shallower region of atomic, mixing and has thus been favored as an etching beam for depth profiling in analytical instruments.

When accelerated gas cluster ions are fully dissociated and neutralized, the resulting neutral monomers will have energies approximately equal to the total energy of the original accelerated gas cluster ion, divided by the number, $N_I$, of monomers that comprised the original gas cluster ion at the time it was accelerated. Such dissociated neutral monomers will have energies on the order of from about 1 eV to tens or even as much as a few thousands of eV, depending on the original accelerated energy of the gas cluster ion and the size of the gas cluster at the time of acceleration.

Gas cluster ion beams are generated and transported for purposes of irradiating a workpiece according to known techniques. Various types of holders are known in the art for holding the object in the path of the GCIB for irradiation and for manipulating the object to permit irradiation of a multiplicity of portions of the object. Neutral Beams may be generated and transported for purposes of irradiating a workpiece according to techniques taught herein.

The present invention may employ a high beam purity method and system for deriving from an accelerated gas cluster ion beam an accelerated neutral gas cluster and/or preferably monomer beam that can be employed for a variety of types of surface and shallow subsurface materials processing and which is capable, for many applications, of superior performance compared to conventional GCIB processing. It can provide well-focused, accelerated, intense neutral monomer beams with particles having energies in the range of from about 1 eV to as much as a few thousand eV. This is an energy range in which it has heretofore been impractical with simple, relatively inexpensive apparatus to form intense neutral beams.

These accelerated Neutral Beams are generated by first forming a conventional accelerated GCIB, then partly or essentially fully dissociating it by methods and operating conditions that do not introduce impurities into the beam, then separating the remaining charged portions of the beam from the neutral portion, and subsequently using the resulting accelerated Neutral Beam for workpiece processing. Depending on the degree of dissociation of the gas cluster ions, the Neutral Beam produced may be a mixture of neutral gas monomers and gas clusters or may essentially consist entirely or almost entirely of neutral gas monomers. It is preferred that the accelerated Neutral Beam is a fully dissociated neutral monomer beam.

An advantage of the Neutral Beams that may be produced by the methods and apparatus of this invention, is that they may be used to process electrically insulating materials without producing damage to the material due to charging of the surfaces of such materials by beam transported charges as commonly occurs for all ionized beams including GCIB. For example, in semiconductor and other electronic applications, ions often contribute to damaging or destructive charging of thin dielectric films such as oxides, nitrides, etc. The use of Neutral Beams can enable successful beam processing of polymer, dielectric, and/or other electrically insulating or high electrical resistivity materials, coatings, and films in applications where ion beams may produce undesired side effects due to surface or other charging effects. Examples include (without limitation) processing of corrosion inhibiting coatings, and irradiation cross-linking and/or polymerization of organic films. In other examples, Neutral Beam induced modifications of polymer or other dielectric materials (e.g. sterilization, smoothing, improving surface biocompatibility, and improving attachment of and/or control of elution rates of drugs) may enable the use of such materials in medical devices for implant and/or other medical/surgical applications. Further examples include Neutral Beam processing of glass, polymer, and ceramic materials as well as thin film dielectric coatings on semiconductors such as oxides, nitrides, doped glasses, etc.

Another advantage of accelerated neutral monomer beams derived from an accelerated GCIB, when used in etching applications, is that they form a much shallower disrupted layer in the etched surface when compared even with GCIBs used in the same way. This results in much less atomic depth mixing in the etched surface, as will be shown herein.

Since the parent GCIB, from which accelerated Neutral Beams may be formed by the methods and apparatus of the invention, comprises ions it is readily accelerated to desired energy and is readily focused using conventional ion beam techniques. Upon subsequent dissociation and separation of the charged ions from the neutral particles, the neutral beam particles tend to retain their focused trajectories and may be transported for extensive distances with good effect.

When neutral gas clusters in a jet are ionized by electron bombardment, they become heated and/or excited. This may result in subsequent evaporation of monomers from the ionized gas cluster, after acceleration, as it travels down the beamline. Additionally, collisions of gas cluster ions with background gas molecules in the ionizer, accelerator and beamline regions also heat and excite the gas cluster ions and may result in additional subsequent evolution of monomers from the gas cluster ions following acceleration. When these mechanisms for evolution of monomers are induced by electron bombardment and/or collision with background gas molecules (and/or other gas clusters) of the same gas from which the GCIB was formed, no contamination is contributed to the beam by the dissociation processes that results in evolving the monomers.

There are other mechanisms that can be employed for dissociating (or inducing evolution of monomers from) gas cluster ions in a GCIB without introducing contamination into the beam. Some of these mechanisms may also be employed to dissociate neutral gas clusters in a neutral gas cluster beam. One mechanism is laser irradiation of the cluster-ion beam using infra-red or other laser energy. Laser-induced heating of the gas cluster ions in the laser irradiated GCIB results in excitement and/or heating of the gas cluster ions and causes subsequent evolution of monomers from the beam. Another mechanism is passing the beam through a thermally heated tube so that radiant thermal energy photons impact the gas cluster ions in the beam. The induced heating of the gas cluster ions by the radiant thermal energy in the tube results in excitement and/or heating of the gas cluster ions and causes subsequent evolution of monomers from the beam. In another mechanism, crossing the gas cluster ion beam by a gas jet of the same gas or mixture as the source gas used in formation of the GCIB (or other non-contaminating gas) results in collisions of monomers of the gas in the gas jet with the gas clusters in the ion beam producing excitement and/or heating of the gas cluster ions in the beam and subsequent evolution of monomers from the excited gas cluster ions. By depending entirely on electron bombardment during initial ionization and/or collisions (with other cluster ions, or with background gas molecules of the same gas(es) as those used to form the GCIB) within the beam and/or laser or thermal radiation and/or crossed jet collisions of non-contaminating gas to produce the GCIB dissociation and/or fragmentation, contamination of the beam by collision with other materials is avoided.

As a neutral gas cluster jet from a nozzle travels through an ionizing region where electrons are directed to ionize the clusters, a cluster may remain un-ionized or may acquire a charge state, q, of one or more charges (by ejection of electrons from the cluster by an incident electron). The ionizer operating conditions influence the likelihood that a gas cluster will take on a particular charge state, with more intense ionizer conditions resulting in greater probability that a higher charge state will be achieved. More intense ionizer conditions resulting in higher ionization efficiency may result from higher electron flux and/or higher (within limits) electron energy. Once the gas cluster has been ionized, it is typically extracted from the ionizer, focused into a beam, and accelerated by falling through an electric field. The amount of acceleration of the gas cluster ion is readily controlled by controlling the magnitude of the accelerating electric field. Typical commercial GCIB processing tools generally provide for the gas cluster ions to be accelerated by an electric field having an adjustable accelerating potential, $V_{Acc}$, typically of for example, from about 1 kV to 70 kV (but not limited to that range—$V_{Acc}$ up to 200 kV or even more may be feasible). Thus a singly charged gas cluster ion achieves an energy in the range of from 1 to 70 keV (or more if larger $V_{Acc}$ is used) and a multiply charged (for example, without limitation, charge state, q=3 electronic charges) gas cluster ion achieves an energy in the range of from 3 to 210 keV (or more for higher $V_{Acc}$). For other gas cluster ion charge states and acceleration potentials, the accelerated energy per cluster is $qV_{Acc}$ eV. From a given ionizer with a given ionization efficiency, gas cluster ions will have a distribution of charge states from zero (not ionized) to a higher number such as for example 6 (or with high ionizer efficiency, even more), and the most probable and mean values of the charge state distribution also increase with increased ionizer efficiency (higher electron flux and/or energy). Higher ionizer efficiency also results in increased numbers of gas cluster ions being formed in the ionizer. In many cases, GCIB processing throughput increases when operating the ionizer at high efficiency results in increased GCIB current. A downside of such operation is that multiple charge states that may occur on intermediate size gas cluster ions can increase crater and/or rough interface formation by those ions, and often such effects may operate counterproductively to the intent of the processing. Thus for many GCIB surface processing recipes, selection of the ionizer operating parameters tends to involve more considerations than just maximizing beam current. In some processes, use of a "pressure cell" (see U.S. Pat. No. 7,060,989, to Swenson et al.) may be employed to permit operating an ionizer at high ionization efficiency while still obtaining acceptable beam processing performance by moderating the beam energy by gas collisions in an elevated pressure "pressure cell."

With the present invention there is no downside to operating the ionizer at high efficiency—in fact such operation is sometimes preferred. When the ionizer is operated at high efficiency, there may be a wide range of charge states in the gas cluster ions produced by the ionizer. This results in a wide range of velocities in the gas cluster ions in the extraction region between the ionizer and the accelerating electrode, and also in the downstream beam. This may result in an enhanced frequency of collisions between and among gas cluster ions in the beam that generally results in a higher degree of fragmentation of the largest gas cluster ions. Such fragmentation may result in a redistribution of the cluster sizes in the beam, skewing it toward the smaller cluster sizes. These cluster fragments retain energy in proportion to their new size (N) and so become less energetic while essentially retaining the accelerated velocity of the initial unfragmented gas cluster ion. The change of energy with retention of velocity following collisions has been experimentally verified (as for example reported in Toyoda, N. et al., "Cluster size dependence on energy and velocity distributions of gas cluster ions after collisions with residual gas," Nucl. Instr. & Meth. in Phys. Research B 257 (2007), pp 662-665). Fragmentation may also result in redistribution of charges in the cluster fragments. Some uncharged fragments likely result and multi-charged gas cluster ions may fragment into several charged gas cluster ions and perhaps some uncharged fragments. It is understood by the inventors that design of the focusing fields in the ionizer and the extraction region may enhance the focusing of the smaller gas cluster ions and monomer ions to increase the likelihood of collision with larger gas cluster ions in the beam extraction region and in the downstream beam, thus contributing to the dissociation and/or fragmenting of the gas cluster ions.

In an embodiment of the present invention, background gas pressure in the ionizer, acceleration region, and beamline may optionally be arranged to have a higher pressure than is normally utilized for good GCIB transmission. This can result in additional evolution of monomers from gas cluster ions (beyond that resulting from the heating and/or excitement resulting from the initial gas cluster ionization event). Pressure may be arranged so that gas cluster ions have a short enough mean-free-path and a long enough flight path between ionizer and workpiece that they must undergo multiple collisions with background gas molecules.

For a homogeneous gas cluster ion containing N monomers and having a charge state of q and which has been accelerated through an electric field potential drop of $V_{Acc}$ volts, the cluster will have an energy of approximately $qV_{Acc}/N_I$ eV per monomer, where $N_I$ is the number of monomers in the cluster ion at the time of acceleration. Except for the smallest gas cluster ions, a collision of such an ion with a background gas monomer of the same gas as the cluster source gas will result in additional deposition of approximately $qV_{Acc}/N_I$ eV into the gas cluster ion. This energy is relatively small compared to the overall gas cluster ion energy ($qV_{Acc}$) and generally results in excitation or heating of the cluster and in subsequent evolution of monomers from the cluster. It is believed that such collisions of larger clusters with background gas seldom fragment the cluster but rather heats and/or excites it to result in evolution of monomers by evaporation or similar mechanisms. Regardless of the source of the excitation that results in the evolution of a monomer or monomers from a gas cluster ion, the evolved monomer(s) have approximately the same energy per particle, $qV_{Acc}/N_I$ eV, and retain approximately the same velocity and trajectory as the gas cluster ion from which they have evolved. When such monomer evolutions occur from a gas cluster ion, whether they result from excitation or heating due to the original ionization event, a collision, or radiant heating, the charge has a high probability of remaining with the larger residual gas cluster ion. Thus after a sequence of monomer evolutions, a large gas cluster ion may be reduced to a cloud of co-traveling monomers with perhaps a smaller residual gas cluster ion (or possibly several if fragmentation has also occurred). The co-traveling monomers following the original beam trajectory all have approximately the same velocity as that of the original gas cluster ion and each has energy of approximately $qV_{Acc}/N_I$ eV. For small gas cluster ions, the energy of collision with a background gas monomer is likely to completely and violently dissociate the small gas cluster and it is uncertain whether in such cases the resulting monomers continue to travel with the beam or are ejected from the beam.

Prior to the GCIB reaching the workpiece, the remaining charged particles (gas cluster ions, particularly small and intermediate size gas cluster ions and some charged monomers, but also including any remaining large gas cluster ions) in the beam are separated from the neutral portion of the beam, leaving only a Neutral Beam for processing the workpiece.

In typical operation, the fraction of power in the neutral beam components relative to that in the full (charged plus neutral) beam delivered at the processing target is in the range of from about 5% to 95%, so by the separation methods and apparatus of the present invention it is possible to deliver that portion of the kinetic energy of the full accelerated charged beam to the target as a Neutral Beam.

The dissociation of the gas cluster ions and thus the production of high neutral monomer beam energy is facilitated by 1) Operating at higher acceleration voltages. This increases $qV_{Acc}/N$ for any given cluster size. 2) Operating at high ionizer efficiency. This increases $qV_{Acc}/N$ for any given cluster size by increasing q and increases cluster-ion on cluster-ion collisions in the extraction region due to the differences in charge states between clusters; 3) Operating at a high ionizer, acceleration region, or beamline pressure or operating with a gas jet crossing the beam, or with a longer beam path, all of which increase the probability of background gas collisions for a gas cluster ion of any given size; 4) Operating with laser irradiation or thermal radiant heating of the beam, which directly promote evolution of monomers from the gas cluster ions; and 5) Operating at higher nozzle gas flow, which increases transport of gas, clustered and perhaps unclustered into the GCIB trajectory, which increases collisions resulting in greater evolution of monomers.

Measurement of the Neutral Beam cannot be made by current measurement as is convenient for gas cluster ion beams. A Neutral Beam power sensor is used to facilitate dosimetry when irradiating a workpiece with a Neutral Beam. The Neutral Beam sensor is a thermal sensor that intercepts the beam (or optionally a known sample of the beam). The rate of rise of temperature of the sensor is related to the energy flux resulting from energetic beam irradiation of the sensor. The thermal measurements must be made over a limited range of temperatures of the sensor to avoid errors due to thermal re-radiation of the energy incident on the sensor. For a GCIB process, the beam power (watts) is equal to the beam current (amps) times $V_{Acc}$, the beam acceleration voltage. When a GCIB irradiates a workpiece for a period of time (seconds), the energy (joules) received by the workpiece is the product of the beam power and the irradiation time. The processing effect of such a beam when it processes an extended area is distributed over the area (for example, $cm^2$). For ion beams, it has been conveniently conventional to specify a processing dose in terms of irradiated ions/$cm^2$, where the ions are either known or assumed to have at the time of acceleration an average charge state, q, and to have been accelerated through a potential difference of, $V_{Acc}$ volts, so that each ion carries an energy of q $V_{Acc}$ eV (an eV is approximately $1.6 \times 10^{-19}$ joule). Thus an ion beam dose for an average charge state, q, accelerated by $V_{Acc}$ and specified in ions/$cm^2$ corresponds to a readily calculated energy dose expressible in joules/$cm^2$. For an accelerated Neutral Beam derived from an accelerated GCIB as utilized in the present invention, the value of q at the time of acceleration and the value of $V_{Acc}$ is the same for both of the (later-formed and separated) charged and uncharged fractions of the beam. The power in the two (neutral and charged) fractions of the GCIB divides proportional to the mass in each beam fraction. Thus for the accelerated Neutral Beam as employed in the invention, when equal areas are irradiated for equal times, the energy dose (joules/$cm^2$) deposited by the Neutral Beam is necessarily less than the energy dose deposited by the full GCIB. By using a thermal sensor to measure the power in the full GCIB $P_G$ and that in the Neutral Beam $P_N$ (which is commonly found to be about 5% to 95% that of the full GCIB) it is possible to calculate a compensation factor for use in the Neutral Beam processing dosimetry. When $P_N$ is $aP_G$, then the compensation factor is, $k=1/a$. Thus if a workpiece is processed using a Neutral Beam derived from a GCIB, for a time duration is made to be k times greater than the processing duration for the full GCIB (including charged and neutral beam portions) required to achieve a dose of D ions/cm$^2$, then the energy doses deposited in the workpiece by both the Neutral Beam and the full GCIB are the same (though the results may be different due to qualitative differences in the processing effects due to differences of particle sizes in the two beams.) As used herein, a Neutral Beam process dose compensated in this way is sometimes described as having an energy/cm$^2$ equivalence of a dose of D ions/cm$^2$.

Use of a Neutral Beam derived from a gas cluster ion beam in combination with a thermal power sensor for dosimetry in many cases has advantages compared with the use of the full gas cluster ion beam or an intercepted or diverted portion, which inevitably comprises a mixture of gas cluster ions and neutral gas clusters and/or neutral monomers, and which is conventionally measured for dosimetry purposes by using a beam current measurement. Some advantages are as follows:

1) The dosimetry can be more precise with the Neutral Beam using a thermal sensor for dosimetry because the total power of the beam is measured. With a GCIB employing the traditional beam current measurement for dosimetry, only the contribution of the ionized portion of the beam is measured and employed for dosimetry. Minute-to-minute and setup-to-setup changes to operating conditions of the GCIB apparatus may result in variations in the fraction of neutral monomers and neutral clusters in the GCIB. These variations can result in process variations that may be less controlled when the dosimetry is done by beam current measurement.

2) With a Neutral Beam, any material may be processed, including highly insulating materials and other materials that may be damaged by electrical charging effects, without the necessity of providing a source of target neutralizing electrons to prevent workpiece charging due to charge transported to the workpiece by an ionized beam. When employed with conventional GCIB, target neutralization to reduce charging is seldom perfect, and the neutralizing electron source itself often introduces problems such as workpiece heating, contamination from evaporation or sputtering in the electron source, etc. Since a Neutral Beam does not transport charge to the workpiece, such problems are reduced.

3) There is no necessity for an additional device such as a large aperture high strength magnet to separate energetic monomer ions from the Neutral Beam. In the case of conventional GCIB the risk of energetic monomer ions (and other small cluster ions) being transported to the workpiece, where they penetrate producing deep damage, is significant and an expensive magnetic filter is routinely required to separate such particles from the beam. In the case of the Neutral Beam apparatus of the invention, the separation of all ions from the beam to produce the Neutral Beam inherently removes all monomer ions.

One embodiment of the present invention provides an apparatus for depth profile analysis of a material composition of a workpiece, the apparatus comprising: a reduced pressure chamber; an etching beam source within the reduced pressure chamber for providing a Neutral Beam having a trajectory; holding means for disposing the workpiece within the reduced pressure chamber and within the trajectory of the Neutral Beam for etching a surface region of the workpiece; control means for etching a controlled depth of the workpiece at a selected region of the surface of the workpiece, using the Neutral Beam to form an etched surface region; a probe beam source for directing a probe beam at the etched surface region of the workpiece to induce emission of radiation from the etched surface region; an analytical sensor for detecting radiation emitted from the etched surface region and for analyzing the composition of the region; and control means for repeatedly etching, probing, sensing, and analyzing the etched surface region to form a depth profile analysis of the material composition of the workpiece.

The etching beam source may further comprise: a gas cluster ion beam source for forming a gas cluster ion beam; accelerating means for accelerating the gas cluster ion beam; means for at least partially dissociating the gas cluster ion beam; and means for separating ionized components of the accelerated gas cluster ion beam from neutral components to form the Neutral Beam.

The holding means may further comprise positioning means for positioning a selected region of the workpiece in the trajectory of the Neutral Beam. The holding means may further comprise scanning means for scanning a selected region of the workpiece in the trajectory of the Neutral Beam. The probe beam source may be an ion beam source or an x-ray source. The analytical sensor may comprise an ion sensor, or and electron sensor, or a photon sensor. The apparatus of claim 1, wherein the apparatus is a: SIMS depth profile analysis apparatus; XPS depth profile analysis apparatus; or ESCA depth profile analysis apparatus. The Neutral Beam may comprise neutral monomers selected from the group consisting of argon, an inert gas, oxygen, carbon dioxide, nitrogen, ammonia, fluorine, sulfur hexafluoride, tetrafluoromethane, and a condensable halogen-containing gas. The workpiece material may comprise a semiconductor, an oxide, a nitride, silicon, silicon dioxide, a polymer, a dielectric, an electrically insulating material, a high electrical resistivity material, a glass, or a ceramic.

Another embodiment of the present invention provides an analytical method of performing an analysis of a material composition of an object disposed in a reduced pressure atmosphere, comprising the steps of: a. providing a reduced pressure chamber; b. forming a Neutral Beam having a trajectory within the reduced pressure chamber; c. providing holding means for disposing the object within the reduced pressure chamber in the trajectory of the Neutral Beam; e. irradiating the object with the Neutral Beam to etch a surface region of the object; f. directing a probe beam at the etched surface region and detecting radiation from the etched surface region using an analytical sensor; and g. analyzing the material composition of the object at the etched surface region.

The method may further comprise the step of: repeating steps f. through g. during step e. and generating a depth profile analysis of the material composition of the object. The method may further comprise the step of: repeating steps e. through g. and generating a depth profile analysis of the material composition of the object. The method may further comprise the steps of: injecting a pressurized source gas into the low pressure chamber to form a gas cluster jet; ionizing at least a portion of the gas cluster jet to form a gas cluster ion beam; accelerating the gas cluster ion beam; at least partially dissociating the accelerated gas cluster ion beam; and separating ionized components of the gas cluster ion beam from neutral components to form the Neutral Beam.

The probe beam may be an ion beam or an x-ray beam. The analytical sensor may comprise an ion sensor, or an electron sensor, or a photon sensor. The depth profile analysis may be a SIMS depth profile analysis or an XPS depth profile analysis, or an ESCA depth profile analysis of the material composition of the object. The step of at least partially dissociating the accelerated gas cluster ion beam substantially completely dissociates the gas cluster ion beam.

DETAILED DESCRIPTION OF THE PREFERRED METHODS AND EXEMPLARY EMBODIMENTS

In the following description, for simplification, item numbers from earlier-described figures may appear in subsequently-described figures without discussion. Likewise, items discussed in relation to earlier figures may appear in subsequent figures without item numbers or additional description. In such cases items with like numbers are like items and have the previously-described features and functions, and illustration of items without item numbers shown in the present figure refer to like items having the same functions as the like items illustrated in earlier-discussed numbered figures.

An Accelerated Low Energy Neutral Beam Derived from an Accelerated GCIB

Figure 1:
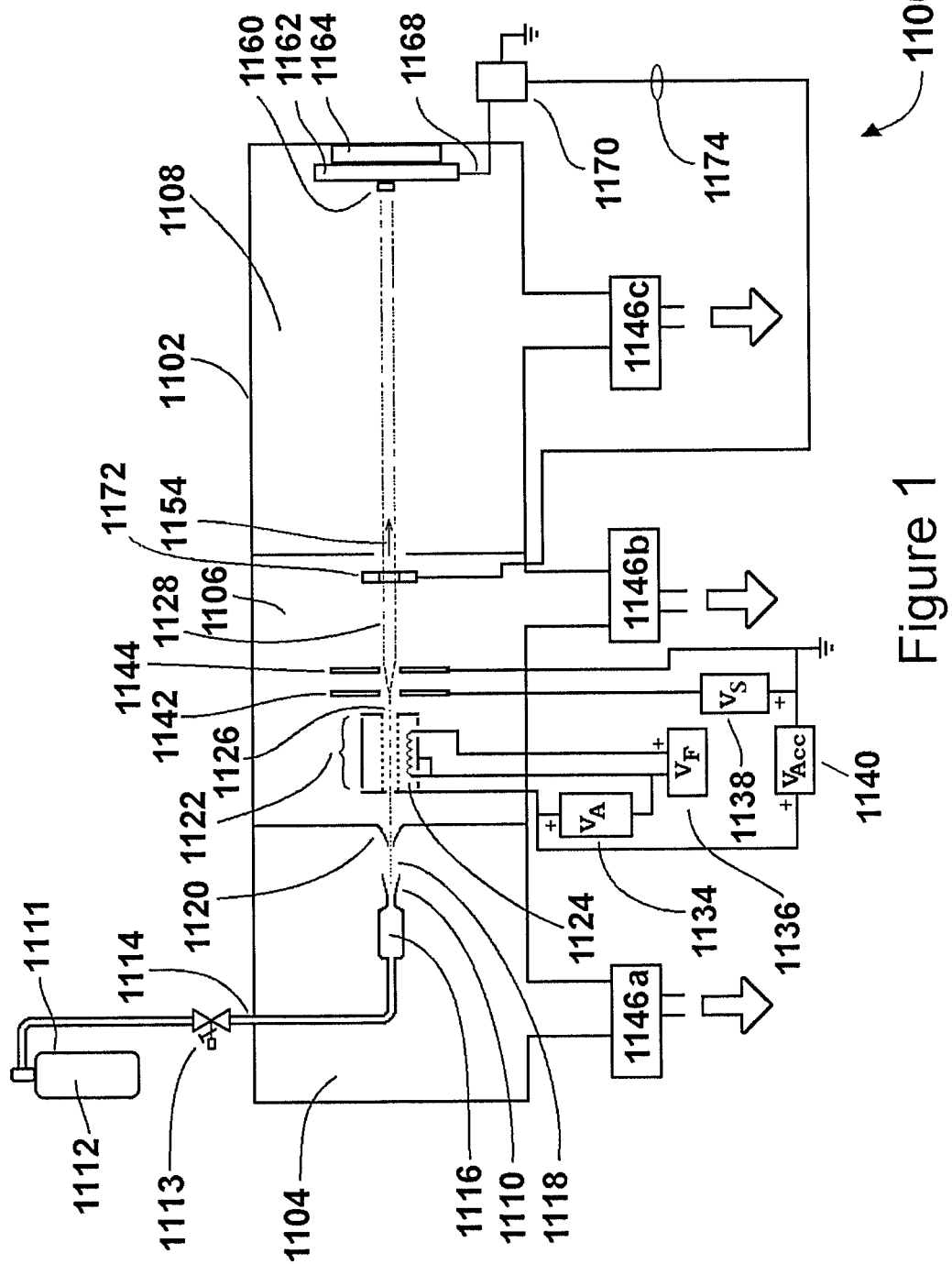
FIG. 1 is a schematic illustrating elements of a GCIB processing apparatus 1100 for processing a workpiece using a GCIB.

Reference is now made to FIG. 1, which shows a schematic configuration for a GCIB processing apparatus 1100. A low-pressure vessel 1102 has three fluidly connected chambers: a nozzle chamber 1104, an ionization/acceleration chamber 1106, and a processing chamber 1108. The three chambers are evacuated by vacuum pumps 1146a, 1146b, and 1146c, respectively. A pressurized condensable source gas 1112 (for example argon) stored in a gas storage cylinder 1111 flows through a gas metering valve 1113 and a feed tube 1114 into a stagnation chamber 1116. Pressure (typically a few atmospheres) in the stagnation chamber 1116 results in ejection of gas into the substantially lower pressure vacuum through a nozzle 1110, resulting in formation of a supersonic gas jet 1118. Cooling, resulting from the expansion in the jet, causes a portion of the gas jet 1118 to condense into clusters, each consisting of from several to several thousand weakly bound atoms or molecules. A gas skimmer aperture 1120 is employed to control flow of gas into the downstream chambers by partially separating gas molecules that have not condensed into a cluster jet from the cluster jet. Excessive pressure in the downstream chambers can be detrimental by interfering with the transport of gas cluster ions and by interfering with management of the high voltages that may be employed for beam formation and transport. Suitable condensable source gases 1112 include, but are not limited to argon and other condensable noble gases, nitrogen, carbon dioxide, oxygen, and many other gases and/or gas mixtures. After formation of the gas clusters in the supersonic gas jet 1118, at least a portion of the gas clusters are ionized in an ionizer 1122 that is typically an electron impact ionizer that produces electrons by thermal emission from one or more incandescent filaments 1124 (or from other suitable electron sources) and accelerates and directs the electrons, enabling them to collide with gas clusters in the gas jet 1118. Electron impacts with gas clusters eject electrons from some portion of the gas clusters, causing those clusters to become positively ionized. Some clusters may have more than one electron ejected and may become multiply ionized. Control of the number of electrons and their energies after acceleration typically influences the number of ionizations that may occur and the ratio between multiple and single ionizations of the gas clusters. A suppressor electrode 1142, and grounded electrode 1144 extract the cluster ions from the ionizer exit aperture 1126, accelerate them to a desired energy (typically with acceleration potentials of from several hundred V to several tens of kV), and focuses them to form a GCIB 1128. The region that the GCIB 1128 traverses between the ionizer exit aperture 126 and the suppressor electrode 1142 is referred to as the extraction region. The axis (determined at the nozzle 1110), of the supersonic gas jet 1118 containing gas clusters is substantially the same as the axis 1154 of the GCIB 1128. Filament power supply 1136 provides filament voltage Vf to heat the ionizer filament 1124. Anode power supply 1134 provides anode voltage VA to accelerate thermoelectrons emitted from filament 1124 to cause the thermoelectrons to irradiate the cluster-containing gas jet 1118 to produce cluster ions. A suppression power supply 1138 supplies suppression voltage VS (on the order of several hundred to a few thousand volts) to bias suppressor electrode 1142. Accelerator power supply 1140 supplies acceleration voltage VAcc to bias the ionizer 1122 with respect to suppressor electrode 1142 and grounded electrode 1144 so as to result in a total GCIB acceleration potential equal to VAcc. Suppressor electrode 1142 serves to extract ions from the ionizer exit aperture 1126 of ionizer 1122 and to prevent undesired electrons from entering the ionizer 1122 from downstream, and to form a focused GCIB 1128.

A workpiece 1160, which may (for example) be a medical device, a semiconductor material, an optical element, or other workpiece to be processed by GCIB processing, is held on a workpiece holder 1162, which disposes the workpiece in the path of the GCIB 1128. The workpiece holder is attached to but electrically insulated from the processing chamber 1108 by an electrical insulator 1164. Thus, GCIB 1128 striking the workpiece 1160 and the workpiece holder 1162 flows through an electrical lead 1168 to a dose processor 1170. A beam gate 1172 controls transmission of the GCIB 1128 along axis 1154 to the workpiece 1160. The beam gate 1172 typically has an open state and a closed state that is controlled by a linkage 1174 that may be (for example) electrical, mechanical, or electromechanical. Dose processor 1170 controls the open/closed state of the beam gate 1172 to manage the GCIB dose received by the workpiece 1160 and the workpiece holder 1162. In operation, the dose processor 1170 opens the beam gate 1172 to initiate GCIB irradiation of the workpiece 1160. Dose processor 1170 typically integrates GCIB electrical current arriving at the workpiece 1160 and workpiece holder 1162 to calculate an accumulated GCIB irradiation dose. At a predetermined dose, the dose processor 1170 closes the beam gate 1172, terminating processing when the predetermined dose has been achieved.

Figure 2:
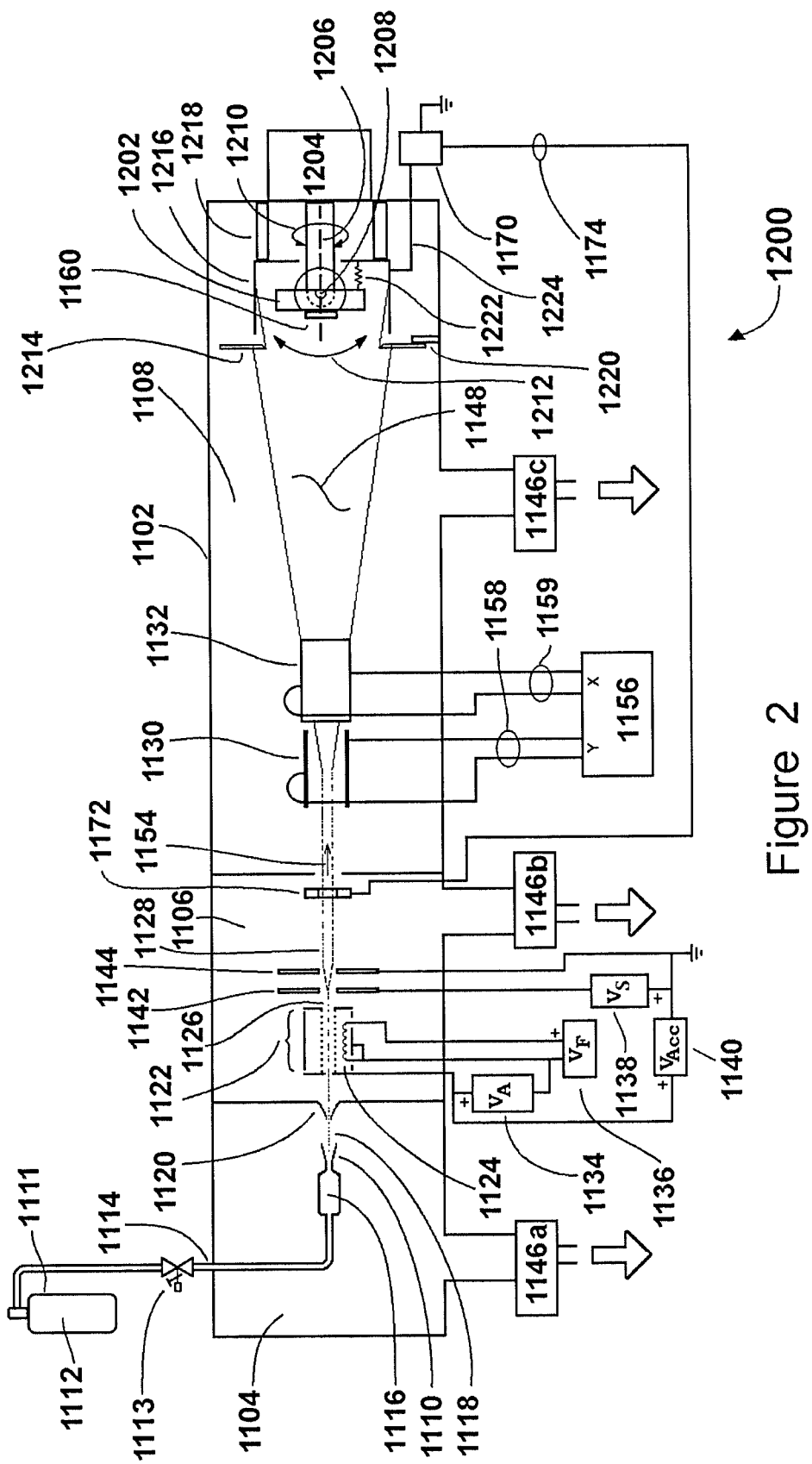
FIG. 2 is a schematic illustrating elements of another GCIB processing apparatus 1200 for workpiece processing using a GCIB, wherein scanning of the ion beam and manipulation of the workpiece is employed.

FIG. 2 shows a schematic illustrating elements of another GCIB processing apparatus 1200 for workpiece processing using a GCIB, wherein scanning of the ion beam and manipulation of the workpiece is employed. A workpiece 1160 to be processed by the GCIB processing apparatus 1200 is held on a workpiece holder 1202, disposed in the path of the GCIB 1128. In order to accomplish uniform processing of the workpiece 1160, the workpiece holder 1202 is designed to manipulate workpiece 1160, as may be required for uniform processing.

Any workpiece surfaces that are non-planar, for example, spherical or cup-like, rounded, irregular, or other un-flat configuration, may be oriented within a range of angles with respect to the beam incidence to obtain optimal GCIB processing of the workpiece surfaces. The workpiece holder 1202 can be fully articulated for orienting all non-planar surfaces to be processed in suitable alignment with the GCIB 1128 to provide processing optimization and uniformity. More specifically, when the workpiece 1160 being processed is non-planar, the workpiece holder 1202 may be rotated in a rotary motion 1210 and articulated in articulation motion 1212 by an articulation/rotation mechanism 1204. The articulation/rotation mechanism 1204 may permit 360 degrees of device rotation about longitudinal axis 1206 (which is coaxial with the axis 1154 of the GCIB 1128) and sufficient articulation about an axis 1208 perpendicular to axis 1206 to maintain the workpiece surface to within a desired range of beam incidence.

Under certain conditions, depending upon the size of the workpiece 1160, a scanning system may be desirable to produce uniform irradiation of a large workpiece. Although often not necessary for GCIB processing, two pairs of orthogonally oriented electrostatic scan plates 1130 and 1132 may be utilized to produce a raster or other scanning pattern over an extended processing area. When such beam scanning is performed, a scan generator 1156 provides X-axis scanning signal voltages to the pair of scan plates 1132 through lead pair 1159 and Y-axis scanning signal voltages to the pair of scan plates 1130 through lead pair 1158. The scanning signal voltages are commonly triangular waves of different frequencies that cause the GCIB 1128 to be converted into a scanned GCIB 1148, which scans the entire surface of the workpiece 1160. A scanned beam-defining aperture 1214 defines a scanned area. The scanned beam-defining aperture 1214 is electrically conductive and is electrically connected to the low-pressure vessel 1102 wall and supported by support member 1220. The workpiece holder 1202 is electrically connected via a flexible electrical lead 1222 to a faraday cup 1216 that surrounds the workpiece 1160 and the workpiece holder 1202 and collects all the current passing through the defining aperture 1214. The workpiece holder 1202 is electrically isolated from the articulation/rotation mechanism 1204 and the faraday cup 1216 is electrically isolated from and mounted to the low-pressure vessel 1102 by insulators 1218. Accordingly, all current from the scanned GCIB 1148, which passes through the scanned beam-defining aperture 1214 is collected in the faraday cup 1216 and flows through electrical lead 1224 to the dose processor 1170. In operation, the dose processor 1170 opens the beam gate 1172 to initiate GCIB irradiation of the workpiece 1160. The dose processor 1170 typically integrates GCIB electrical current arriving at the workpiece 1160 and workpiece holder 1202 and faraday cup 1216 to calculate an accumulated GCIB irradiation dose per unit area. At a predetermined dose, the dose processor 1170 closes the beam gate 1172, terminating processing when the predetermined dose has been achieved. During the accumulation of the predetermined dose, the workpiece 1160 may be manipulated by the articulation/rotation mechanism 1204 to ensure processing of all desired surfaces.

Figure 3:
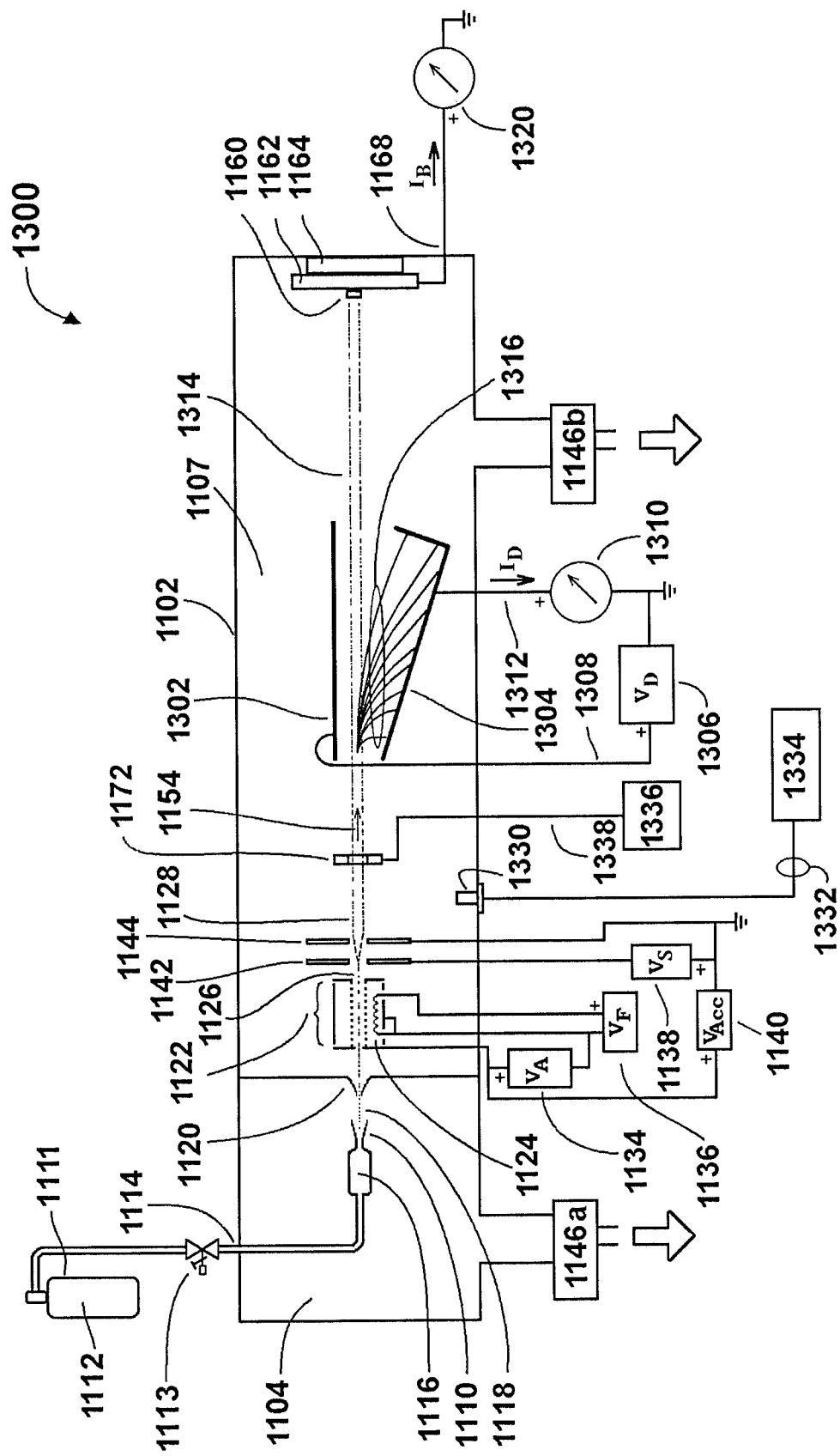
FIG. 3 is a schematic of a Neutral Beam processing apparatus 1300 according to an embodiment of the invention, which uses electrostatic deflection plates to separate the charged and uncharged beams.

FIG. 3 is a schematic of a Neutral Beam processing apparatus 1300 of an exemplary type that may be employed for Neutral Beam processing according to embodiments of the invention. It uses electrostatic deflection plates to separate the charged and uncharged portions of a GCIB. A beamline chamber 1107 encloses the ionizer and accelerator regions and the workpiece processing regions. The beamline chamber 1107 has high conductance and so the pressure is substantially uniform throughout. A vacuum pump 1146b evacuates the beamline chamber 1107. Gas flows into the beamline chamber 1107 in the form of clustered and unclustered gas transported by the gas jet 1118 and in the form of additional unclustered gas that leaks through the gas skimmer aperture 1120. A pressure sensor 1330 transmits pressure data from the beamline chamber 1107 through an electrical cable 1332 to a pressure sensor controller 1334, which measures and displays pressure in the beamline chamber 1107. The pressure in the beamline chamber 1107 depends on the balance of gas flow into the beamline chamber 1107 and the pumping speed of the vacuum pump 1146b. By selection of the diameter of the gas skimmer aperture 1120, the flow of source gas 1112 through the nozzle 1110, and the pumping speed of the vacuum pump 1146b, the pressure in the beamline chamber 1107 equilibrates at a pressure, PB, determined by design and by nozzle flow. The beam flight path from grounded electrode 1144 to workpiece holder 162, is for example, 100 cm. By design and adjustment PB may be approximately $6 \times 10^{-5}$ torr ($8 \times 10^{-3}$ pascal). Thus the product of pressure and beam path length is approximately $6 \times 10^{-3}$ torr-cm (0.8 pascal-cm) and the gas target thickness for the beam is approximately $1.94 \times 10^{14}$ gas molecules per cm2, which is observed to be effective for dissociating the gas cluster ions in the GCIB 1128. VAcc may be for example 30 kV and the GCIB 1128 is accelerated by that potential. A pair of deflection plates (1302 and 1304) is disposed about the axis 1154 of the GCIB 1128. A deflector power supply 1306 provides a positive deflection voltage VD to deflection plate 1302 via electrical lead 1308. Deflection plate 1304 is connected to electrical ground by electrical lead 1312 and through current sensor/display 1310. Deflector power supply 1306 is manually controllable. VD may be adjusted from zero to a voltage sufficient to completely deflect the ionized portion 1316 of the GCIB 1128 onto the deflection plate 1304 (for example a few thousand volts). When the ionized portion 1316 of the GCIB 1128 is deflected onto the deflection plate 1304, the resulting current, ID flows through electrical lead 1312 and current sensor/display 1310 for indication. When VD is zero, the GCIB 1128 is undeflected and travels to the workpiece 1160 and the workpiece holder 1162. The GCIB beam current IB is collected on the workpiece 1160 and the workpiece holder 1162 and flows through electrical lead 1168 and current sensor/display 1320 to electrical ground. IB is indicated on the current sensor/display 1320. A beam gate 1172 is controlled through a linkage 1338 by beam gate controller 1336. Beam gate controller 1336 may be manual or may be electrically or mechanically timed by a preset value to open the beam gate 1172 for a predetermined interval. In use, VD is set to zero and the beam current, IB, striking the workpiece holder is measured. Based on previous experience for a given GCIB process recipe, an initial irradiation time for a given process is determined based on the measured current, IB. VD is increased until all measured beam current is transferred from IB to ID and ID no longer increases with increasing VD. At this point a Neutral Beam 1314 comprising energetic dissociated components of the initial GCIB 1128 irradiates the workpiece holder 1162. The beam gate 1172 is then closed and the workpiece 1160 placed onto the workpiece holder 1162 by conventional workpiece loading means (not shown). The beam gate 1172 is opened for the predetermined initial radiation time. After the irradiation interval, the workpiece may be examined and the processing time adjusted as necessary to calibrate the duration of Neutral Beam processing based on the measured GCIB beam current IB. Following such a calibration process, additional workpieces may be processed using the calibrated exposure duration.

The Neutral Beam 1314 contains a repeatable fraction of the initial energy of the accelerated GCIB 1128. The remaining ionized portion 1316 of the original GCIB 1128 has been removed from the Neutral Beam 1314 and is collected by the grounded deflection plate 1304. The ionized portion 1316 that is removed from the Neutral Beam 1314 may include monomer ions and gas cluster ions including intermediate size gas cluster ions. Because of the monomer evaporation mechanisms due to cluster heating during the ionization process, intra-beam collisions, background gas collisions, and other causes (all of which result in erosion of clusters) the Neutral Beam substantially consists of neutral monomers, while the separated charged particles are predominately cluster ions. The inventors have confirmed this by suitable measurements that include re-ionizing the Neutral Beam and measuring the charge to mass ratio of the resulting ions. As will be shown below, certain superior process results are obtained by processing workpieces using this Neutral Beam.

Figure 4:
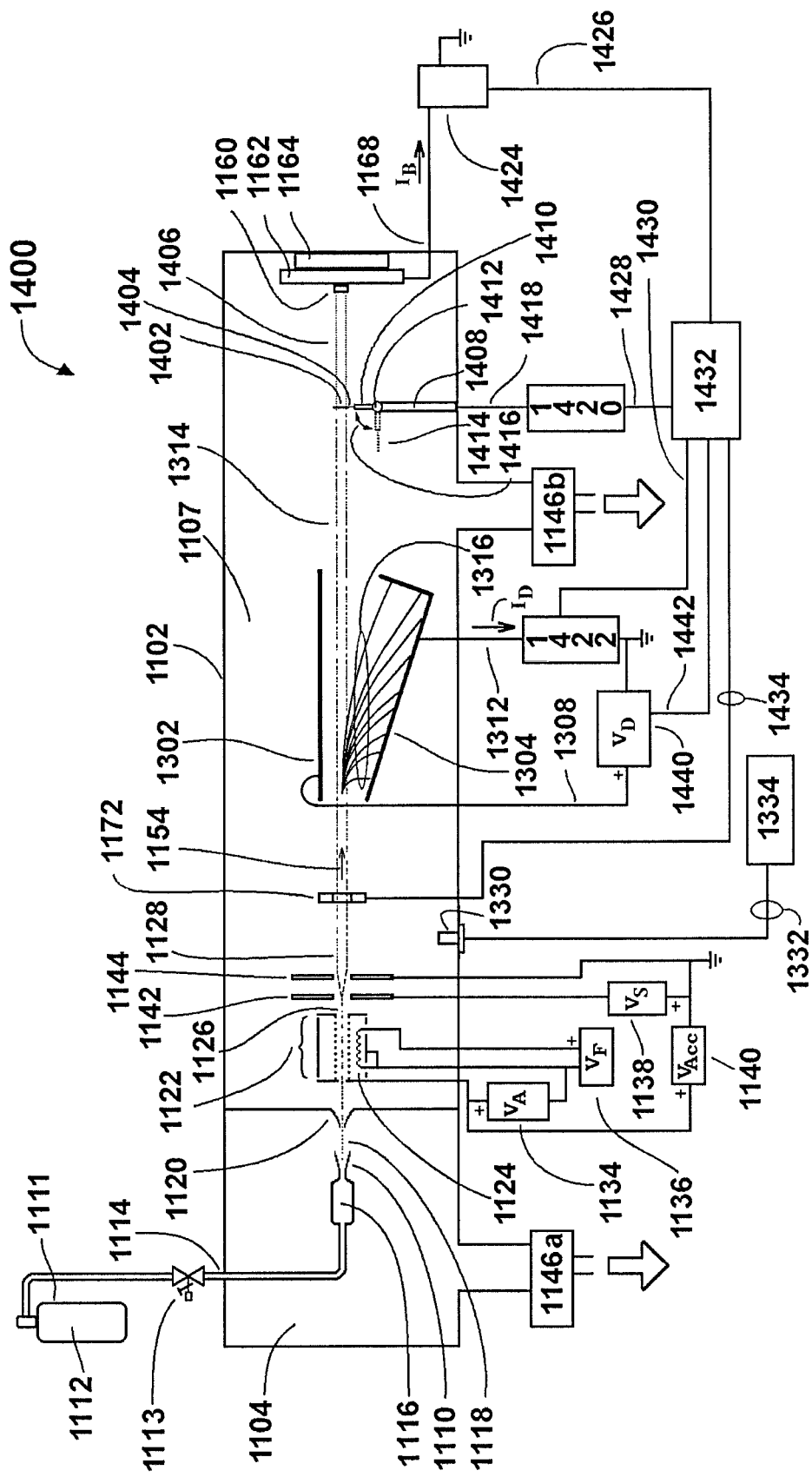
FIG. 4 is a schematic of a Neutral Beam processing apparatus 1400 according to an embodiment of the invention, using a thermal sensor for Neutral Beam measurement.

FIG. 4 is a schematic of a Neutral Beam processing apparatus 1400 as may, for example, be used in generating Neutral Beams as may be employed in embodiments of the invention. It uses a thermal sensor for Neutral Beam measurement. A thermal sensor 1402 attaches via low thermal conductivity attachment 1404 to a rotating support arm 1410 attached to a pivot 1412. Actuator 1408 moves thermal sensor 1402 via a reversible rotary motion 1416 between positions that intercept the Neutral Beam 1314 or GCIB 1128 and a parked position indicated by 1414 where the thermal sensor 1402 does not intercept any beam. When thermal sensor 1402 is in the parked position (indicated by 1414) the GCIB 1128 or Neutral Beam 1314 continues along path 1406 for irradiation of the workpiece 1160 and/or workpiece holder 1162. A thermal sensor controller 1420 controls positioning of the thermal sensor 1402 and performs processing of the signal generated by thermal sensor 1402. Thermal sensor 1402 communicates with the thermal sensor controller 1420 through an electrical cable 1418. Thermal sensor controller 1420 communicates with a dosimetry controller 1432 through an electrical cable 1428. A beam current measurement device 1424 measures beam current IB flowing in electrical lead 1168 when the GCIB 1128 strikes the workpiece 1160 and/or the workpiece holder 1162. Beam current measurement device 1424 communicates a beam current measurement signal to dosimetry controller 1432 via electrical cable 1426. Dosimetry controller 1432 controls setting of open and closed states for beam gate 1172 by control signals transmitted via linkage 1434. Dosimetry controller 1432 controls deflector power supply 1440 via electrical cable 1442 and can control the deflection voltage VD between voltages of zero and a positive voltage adequate to completely deflect the ionized portion 1316 of the GCIB 1128 to the deflection plate 1304. When the ionized portion 1316 of the GCIB 1128 strikes deflection plate 1304, the resulting current ID is measured by current sensor 1422 and communicated to the dosimetry controller 1432 via electrical cable 1430. In operation dosimetry controller 1432 sets the thermal sensor 1402 to the parked position 1414, opens beam gate 1172, sets VD to zero so that the full GCIB 1128 strikes the workpiece holder 1162 and/or workpiece 1160. The dosimetry controller 1432 records the beam current IB transmitted from beam current measurement device 1424. The dosimetry controller 1432 then moves the thermal sensor 1402 from the parked position 1414 to intercept the GCIB 1128 by commands relayed through thermal sensor controller 1420. Thermal sensor controller 1420 measures the beam energy flux of GCIB 1128 by calculation based on the heat capacity of the sensor and measured rate of temperature rise of the thermal sensor 1402 as its temperature rises through a predetermined measurement temperature (for example 70 degrees C.) and communicates the calculated beam energy flux to the dosimetry controller 1432 which then calculates a calibration of the beam energy flux as measured by the thermal sensor 1402 and the corresponding beam current measured by the beam current measurement device 1424. The dosimetry controller 1432 then parks the thermal sensor 1402 at parked position 1414, allowing it to cool and commands application of positive VD to deflection plate 1302 until all of the current ID due to the ionized portion of the GCIB 1128 is transferred to the deflection plate 1304. The current sensor 1422 measures the corresponding ID and communicates it to the dosimetry controller 1432. The dosimetry controller also moves the thermal sensor 1402 from parked position 1414 to intercept the Neutral Beam 1314 by commands relayed through thermal sensor controller 420. Thermal sensor controller 420 measures the beam energy flux of the Neutral Beam 1314 using the previously determined calibration factor and the rate of temperature rise of the thermal sensor 1402 as its temperature rises through the predetermined measurement temperature and communicates the Neutral Beam energy flux to the dosimetry controller 1432. The dosimetry controller 1432 calculates a neutral beam fraction, which is the ratio of the thermal measurement of the Neutral Beam 1314 energy flux to the thermal measurement of the full GCIB 1128 energy flux at sensor 1402. Under typical operation, a neutral beam fraction of from about 5% to about 95% is achieved. Before beginning processing, the dosimetry controller 1432 also measures the current, ID, and determines a current ratio between the initial values of IB and ID. During processing, the instantaneous ID measurement multiplied by the initial IB/ID ratio may be used as a proxy for continuous measurement of the IB and employed for dosimetry during control of processing by the dosimetry controller 1432. Thus the dosimetry controller 1432 can compensate any beam fluctuation during workpiece processing, just as if an actual beam current measurement for the full GCIB 1128 were available. The dosimetry controller uses the neutral beam fraction to compute a desired processing time for a particular beam process. During the process, the processing time can be adjusted based on the calibrated measurement of ID for correction of any beam fluctuation during the process.

Figure 5:
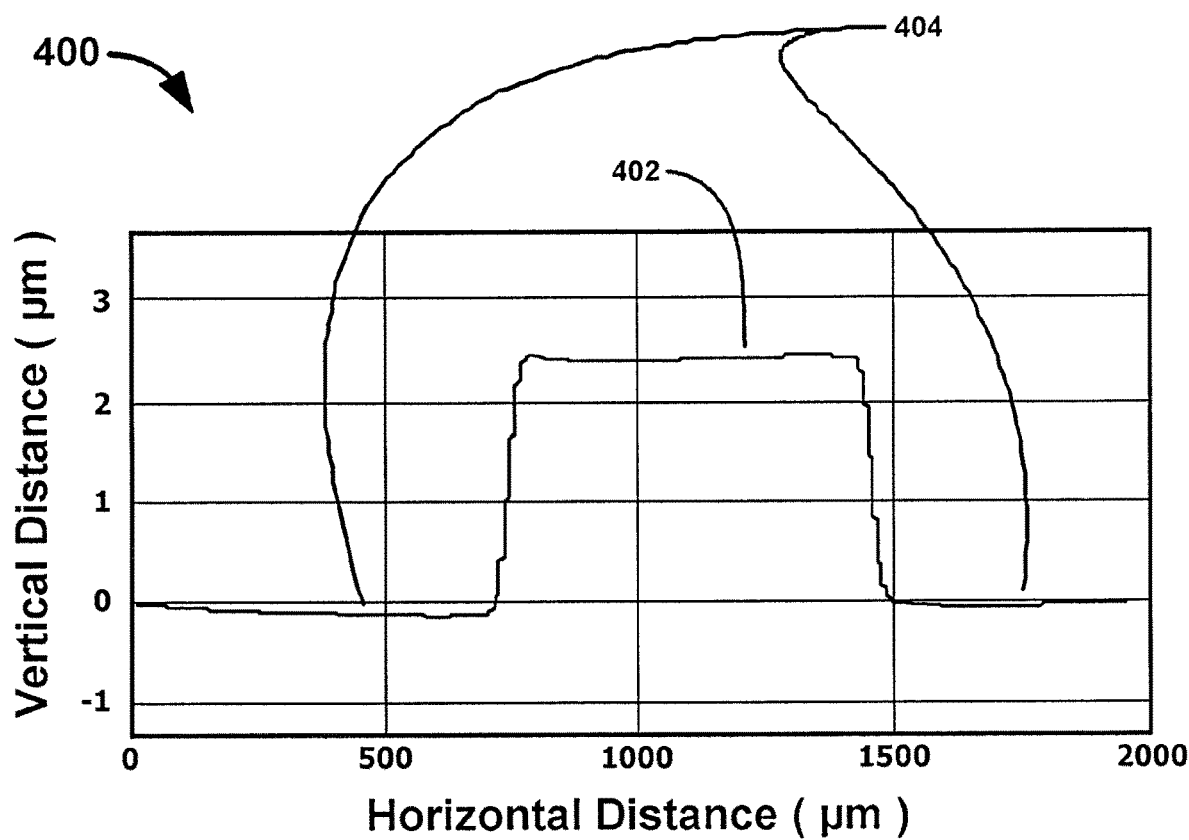
FIG. 5 is a graph 400 illustrating the etching of SiO2 and Si using an embodiment of the invention.

FIG. 5 illustrates a depth profile measurement graph 400 obtained after using an accelerated Neutral Beam derived from a GCIB to etch a silicon dioxide (SiO2) film on a silicon substrate. Using apparatus similar to that shown in FIG. 4, a 30 kV accelerated GCIB was formed using argon. Stagnation chamber pressure was 28 psi (1.93×105 pascal), nozzle flow was 200 standard cm3/minute (3.3 standard cm3/sec). Full beam current (charged plus neutral components prior to separation by deflection was approximately 0.50 microA (µA). The argon gas target thickness for the region between the accelerator and the workpiece was approximately 1.49×1014 argon gas monomers/cm2, and the accelerated Neutral Beam was observed to consist essentially of fully dissociated neutral monomers at the target. Using electrostatic deflection all charged particles were deflected away from the beam axis and out of the beam, forming a Neutral Beam. Thus the Neutral Beam was essentially an accelerated neutral argon monomer beam. Dosimetry was done using a thermal sensor to calibrate the total Neutral Beam dose delivered to the silicon substrate such that a Neutral Beam deposited energy equivalent to that energy which would be deposited by a 2.16×1016 gas cluster ions/cm2 irradiation dose by an accelerated (30 kV) GCIB including both the charged and uncharged particles (without neutralization by charge separation). A silicon dioxide (SiO2) film (approximately 0.5 micron [µm] thick) on a silicon substrate was partially masked with a narrow (approximately 0.7 mm wide) strip of polyimide film tape and then irradiated with the accelerated Neutral Beam. Referring again to FIG. 5, the depth profile measurement graph 400 was generated using a TENCOR Alphastep Model AS-250 profilometer to measure the step profile, in a direction along the surface of the SiO2 film (on silicon substrate) and across the region masked by the polyimide film tape, due to the etching resulting from the accelerated Neutral Beam. Plateau 402 represents the unetched surface of the SiO2 film beneath the polyimide film (after film removal and cleaning), while the regions 404 represent the etched portion. The accelerated Neutral Beam produced an etch depth of approximately 2.4 microns (µm), etching all the way through the 0.5 micron SiO2 film and an additional 1.9 microns into the underlying crystalline silicon substrate, producing the step shown in depth profile measurement graph 400. Argon and other inert gases may be used as source gases to etch by physical means. By using a reactive source gas or using a source gas incorporating a reactive gas in a mixture, reactive etching can also be performed using a Neutral Beam. Typical reactive gases that may be used alone or in mixture with inert gases are (without limitation) oxygen (O2), carbon dioxide (CO2), nitrogen (N2), ammonia (NH3), fluorine (F2), chlorine (Cl2), sulfur hexafluoride (SF6), tetrafluoromethane (CF4), and other condensable halogen-containing gases.

Figure 6:
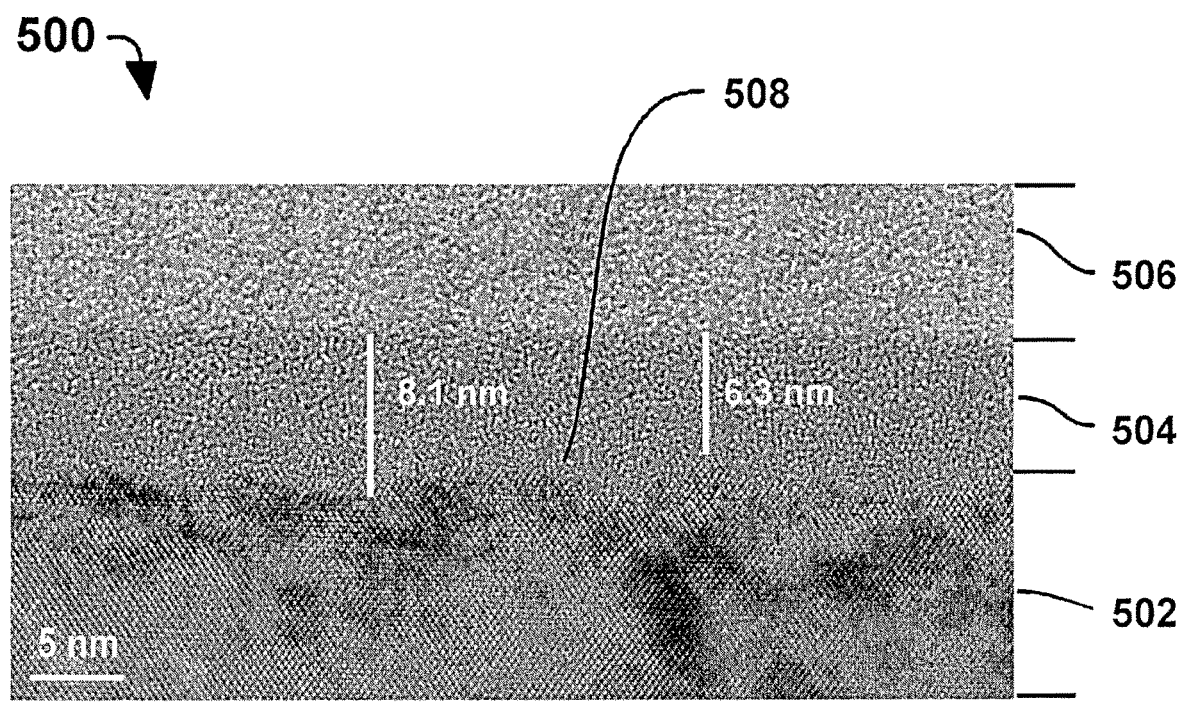
FIG. 6 is a transmission electron microscope (TEM) image 500 of a silicon surface etched using a gas cluster ion beam.
Figure 7:
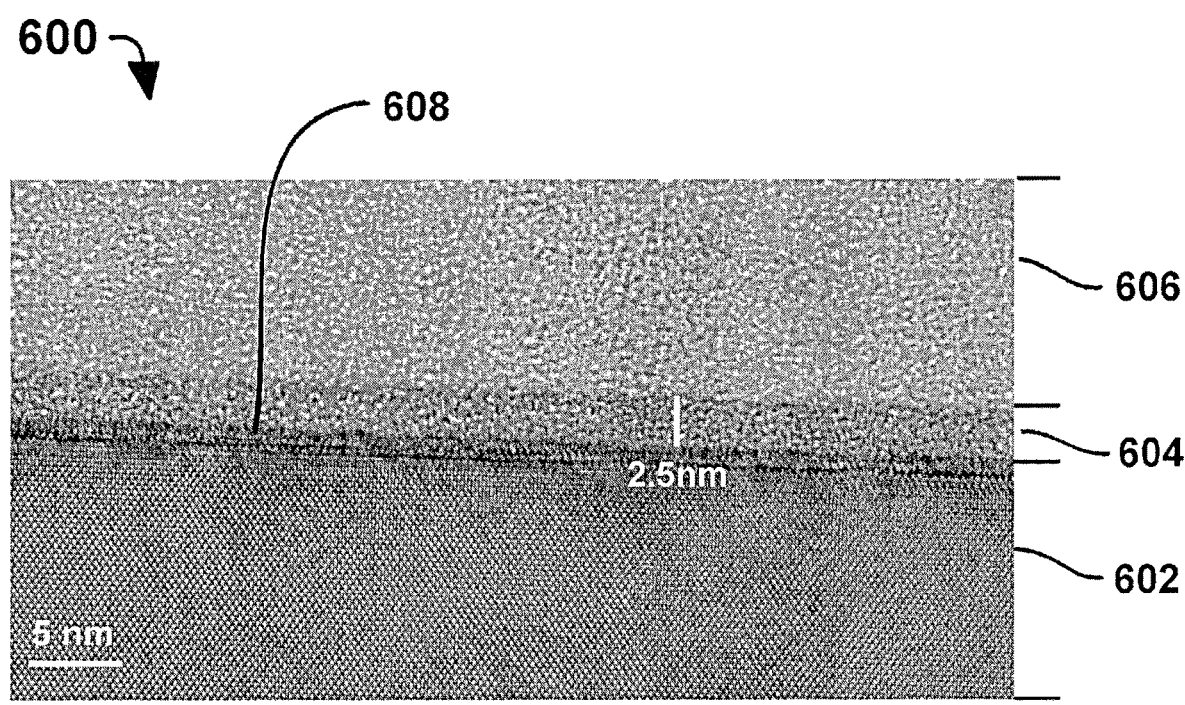
FIG. 7 is a TEM image 600 of a silicon surface etched using an embodiment of the invention.

FIGS. 6 and 7 show the comparative effects of GCIB (charged plus uncharged components) and charge separated Neutral Beam (accelerated neutral monomer beam derived from a GCIB) on a single crystal silicon wafers as may be typically employed in semiconductor applications, and which is often the target of an analytical instrument. In separate instances, the silicon substrates were processed using a full GCIB (charged and neutral components) and an accelerated neutral monomer beam derived from a GCIB (charged components removed from the beam by deflection). Both conditions were derived from the same initial GCIB conditions, a 30 kV accelerated GCIB formed from an argon source gas. For both beams, irradiated doses were matched to the total energy carried by the full beam (charged plus neutral) at an ion dose of 1018 gas cluster ions per cm2. Energy flux rates of each beam were measured using a thermal sensor and process durations were adjusted to ensure that both samples received the same total thermal energy dose equivalent to that of the full (charged plus neutral) GCIB. Both samples were evaluated by sectioning, followed by imaging using transmission electron microscopy (TEM).

FIG. 6 is a TEM image 500 of a section of the surface of a silicon substrate irradiated by the GCIB (charged and neutral beam components). The irradiation was incident on the silicon substrate from the direction of the top of the image toward the bottom of the image. Prior to sectioning for TEM imaging, the top surface (irradiated surface) of the silicon substrate was coated with an epoxy overcoat to facilitate the sectioning operation and to avoid damage to the substrate during the sectioning process. In the TEM image 500, the epoxy overcoat 506 is seen at the top of the image. The irradiation formed an amorphous region 504 comprising silicon and oxygen having a varying thickness with a minimum thickness of approximately 6.3 nm and a maximum thickness of approximately 8.1 nm. A rough interface 508 having a peak-to-peak variation of at least 1.7 nm was formed between the amorphous region 504 and the underlying single crystalline silicon 502, as a result of the GCIB irradiation process. The amorphous region 504 is a mixture region wherein atoms between the upper surface of the amorphous region and the underlying rough surface of the single crystalline silicon 502 are a mixture resulting from beam mixing of the original (pre-irradiation) structure. Thus an analytical instrument analyzing the atoms on the surface or within this amorphous region, measures not the original distribution of atoms in the undisturbed region, but a beam-mixed mixture of the atoms that were present in the original undisturbed depth distribution.

FIG. 7 is a TEM image 600 of a section of the surface of a silicon substrate irradiated by the (charged components separated by deflection and discarded). The irradiation was incident on the silicon substrate from the direction of the top of the image toward the bottom of the image. Prior to sectioning for TEM imaging, the top surface (irradiated surface) of the silicon substrate was coated with an epoxy overcoat to facilitate the sectioning operation and to avoid damage to the substrate during the sectioning process. In the TEM image 600, the epoxy overcoat 606 is seen at the top of the image. The irradiation formed an amorphous region 604 comprising silicon and oxygen having a substantially uniform thickness of approximately 2.5 nm. A smooth interface 608 having a peak-to-peak variation on an atomic scale was formed between the amorphous region 604 and the underlying single crystalline silicon 602, as a result of the accelerated neutral monomer beam irradiation process. The amorphous region 604 is a mixture region wherein atoms between the upper surface of the amorphous region and the underlying rough surface of the single crystalline silicon 602 are a mixture resulting from beam mixing of the original (pre-irradiation) structure. Thus an analytical instrument analyzing the atoms on the surface or within this amorphous region, measures not the original distribution of atoms in the undisturbed region, but a beam-mixed mixture of the atoms that were present in the original undisturbed depth distribution.

The results of processing discussed in relation to FIGS. 6 and 7 indicate that in etching applications, the use of an accelerated Neutral Beam derived from accelerated GCIB by charge separation results in superior interfaces between the irradiation disturbed and undisturbed regions as compared to a GCIB. The reduced thickness (2.5 nm versus 6.3 to 8.1 nm) of the mixture region and the reduced irregularity of the penetration into the undisturbed underlying silicon (the interfaces 508 and 608) mean that the mixture of atoms at the surface and in the amorphous regions represent a depth error reduction on the order of a factor of about 3, and thus enable a similar analytical instrument depth resolution when an accelerated monomer Neutral Beam derived from a GCIB is used as the etching beam (as compared to using the full GCIB (charged plus neutral components) for the etching beam.

Figure 8:
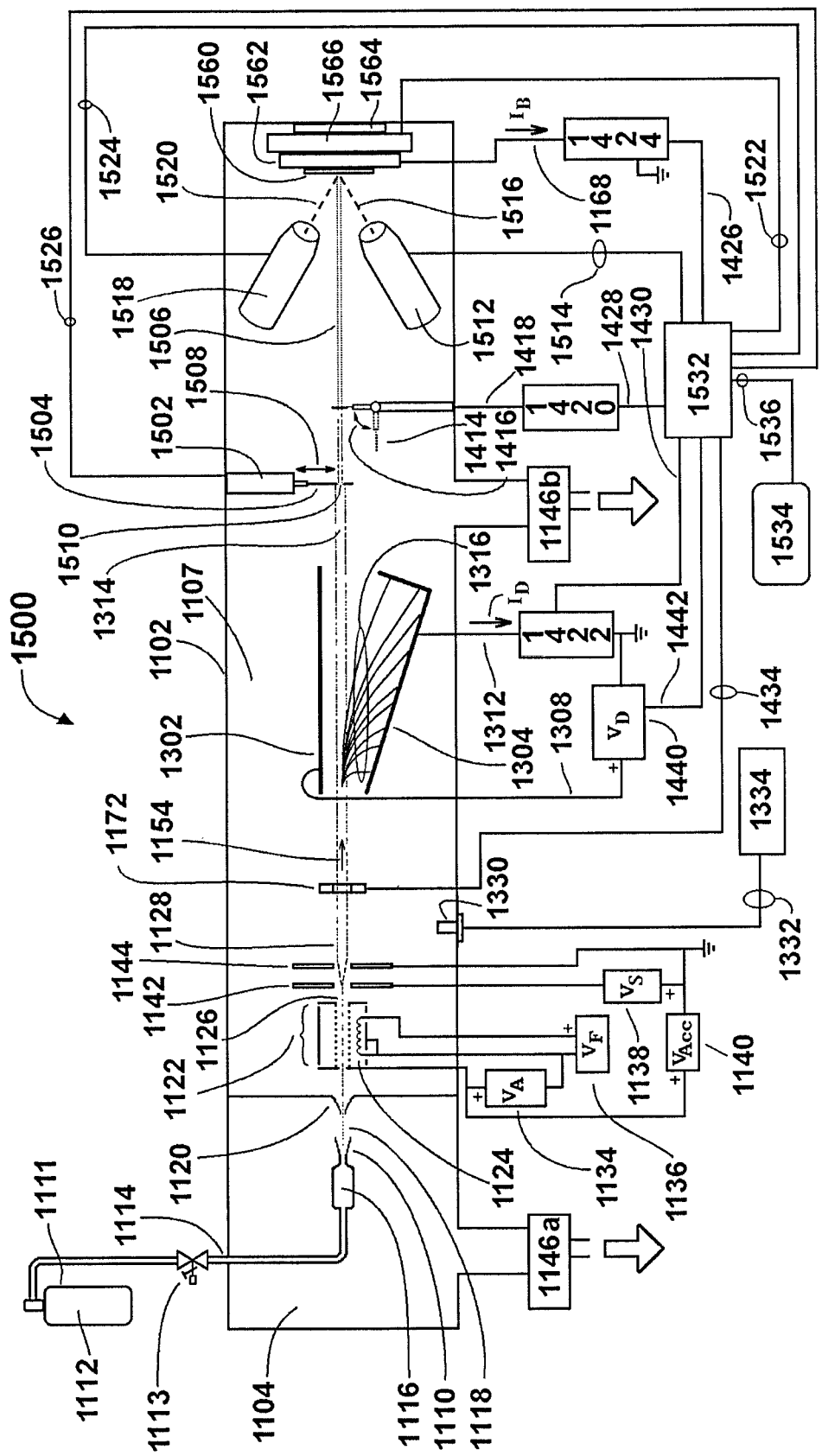
FIG. 8 is a schematic of an analytical instrument 1500 employing an accelerated Neutral Beam derived from a GCIB according to an exemplary embodiment of the invention.

FIG. 8 is a schematic of an analytical instrument 1500 employing an accelerated Neutral Beam derived from a GCIB according to an exemplary embodiment of the invention. The analytical instrument uses a Neutral Beam generation and control system similar to that previously shown in FIG. 4, with additions and modifications allowing the Neutral Beam to function as an etching beam to support depth-profiling analytical measurements in an analytical instrument. Referring again to FIG. 8, a linear actuator 1502 moves an aperture plate 1504 in a linear movement 1508 to place an aperture 1510 into or out of the Neutral Beam 1314. The aperture 1510 may be, for example, a small diameter round aperture on the order of from about 20 microns to about 200 microns in diameter and serves to define the beam diameter to a small diameter, approximately the diameter of the aperture 1510. When the thermal sensor is in the parked position 1414, the reduced diameter Neutral Beam 1506 travels a trajectory to the workpiece 1560. Workpiece 1560 may be for example (not for limitation) a semiconductor wafer. The workpiece is held on a workpiece holder 1562 in turn mounted on an x-y translation table 1566 for positioning the workpiece 1560 relative to the reduced diameter Neutral Beam 1506 and/or for scanning the workpiece 1560 relative to the reduced diameter Neutral Beam. The workpiece 1560, the workpiece holder 1562, and the x-y translation table are supported and electrically insulated so that when it is desired to direct a GCIB 1128 all the way to the workpiece holder, the beam current of the GCIB, IB, can be collected and measured by current measuring device 1424 (as may be desirable during tuning and setup of the GCIB for producing an accelerated Neutral Beam. The x-y translation table moves in two orthogonal directions and can position any part of the workpiece 1560 in the path of the reduced diameter Neutral Beam 1506 and can optionally scan the workpiece in a fine raster pattern to permit uniform etching of larger areas of the workpiece 1560.

A controller 1532 performs all the functions of dosimetry controller 1432 of FIG. 3. Referring again to FIG. 8, controller 1532 performs additional functions in addition to dosimetry functions. Controller 1532 communicates with linear actuator 1502 through electrical cable 1526 and commands linear actuator 1502 to place the aperture 1510 into or out of the Neutral Beam 1314 as may be required during operation. Controller 1532 communicates with the x-y translation table 1566 through electrical cable 1522, and during operation controls positioning and/or scanning of the workpiece 1560 relative to the reduced diameter Neutral Beam 1506.

An analytical probe beam generator 1512 is disposed in the beamline chamber 1107 to direct a probe beam 1516 at the workpiece 1560 for probing the surface characteristics of the workpiece 1560. Controller 1532 communicates with analytical probe beam generator 1512 through electrical cable 1514 and in operation can enable and disable the probe beam 1516 as required. When the probe beam 1516 strikes the workpiece 1560, the surface of the workpiece 1560 emits radiation in the form of particles or waves, some of which travel along path 1520 and are collected by analytical sensor 1518. Controller 1532 communicates with analytical sensor 1518 through electrical cable 1524 and receives information from the analytical sensor. Analytical sensor 1518, may comprise, for example, not for limitation, an ion sensor, an electron sensor, or a photon sensor. Controller 1532 processes the analytical sensor information to analyze the surface properties of the workpiece 1560. A display or printing device 1534 communicates through electrical cable 1536 with controller 1532. Controller 1532 can display or print surface analysis information on the display or printing device 1534.

Optionally, the reduced diameter Neutral Beam 1506 may be used as a probe beam in place of probe beam generator 1512 and probe beam 1516. Optionally, VD maybe set to zero, allowing the GCIB to strike the workpiece if it is desired to use a GCIB as a probe beam. When a probe beam generator 1512 is used it may generate any of a variety of probe beams known in the art of analytical instruments. For example, an ion beam may be used for SIMS analysis, or an x-ray beam may be for XPS or ESCA analysis.

In typical operation, a workpiece 1560 is loaded on the workpiece holder 1560. An analysis of the surface properties of the workpiece is made using probe beam 1516 and analytical sensor 1518. Then the reduced diameter Neutral Beam 1506 is scanned in a fine raster pattern across the surface of the workpiece for a predetermined beam dose to etch away a predetermined thickness of the surface of the workpiece 1560. The etching raster pattern may be for example a square region several hundred microns square (large enough to include the full extent of the probe beam). After etching, another analysis of the properties of the newly exposed surface of the workpiece is made using probe beam 1516 and analytical sensor 1518. Etching and analysis are repeated until the desired depth profile has been measured.

Although the invention has been described for exemplary purposes as using a Neutral Beam derived from a gas cluster ion beam for etching silicon and SiO2, it is understood by the inventors that benefits obtained by application of such Neutral Beam surface processing is not limited to the those materials and that it offers a reduction in the thickness of the beam-mixed region when used for etching other semiconductor materials and indeed for any materials. Although the invention has been described, for examples, with reference to SIMS and XPS/ESCA analysis for depth profiling the constituent characteristics of a material, it is understood by the inventors that the desirable etch characteristics of an accelerated Neutral Beam derived from an accelerated GCIB make it useful for the full spectrum analytical instrument types that use sequential etch steps to facilitate a depth profile characterization of a material by repeated steps of etching and surface analysis, and it is intended that all such applications are included within the scope of the invention.

Although the invention has been described with respect to various embodiments, it should be realized that this invention is also capable of a wide variety of further and other embodiments within the spirit and scope of the invention.

What is claimed:

1. An apparatus for depth profile analysis of a material composition of a workpiece, the apparatus comprising:
   a reduced pressure chamber;
   an etching beam source within the reduced pressure chamber for providing an accelerated and focused Neutral Beam having a trajectory, said etching beam source including means for providing an accelerated and focused beam consisting essentially of dissociated neutral monomers derived from a gas cluster ion beam to form the accelerated and focused Neutral Beam having a controllable dosage for providing controllable surface etching,
   wherein the etching beam source is adapted to form an accelerated and focused gas cluster ion beam, to promote dissociation of gas clusters in the gas cluster ion beam and to remove charged particles from the dissociated beam;
   holding means for disposing the workpiece within the reduced pressure chamber and within the trajectory of the Neutral Beam for etching a surface region of the workpiece;
   control means for etching a controlled depth of the workpiece at a selected region of the surface of the workpiece, using the Neutral Beam to form an etched surface region;
   an analytical sensor for detecting radiation emitted from the etched surface region as induced by a probe beam and for analyzing the composition of the region; and
   control means for repeatedly etching, probing, sensing, and analyzing the etched surface region to form a depth profile analysis of the material composition of the workpiece.

2. The apparatus of claim 1, wherein the etching beam source further comprises:
   a gas cluster ion beam source for forming a gas cluster ion beam;
   accelerating means for accelerating and focusing the gas cluster ion beam;
   means for dissociating gas clusters in the gas cluster ion beam; and
   means for separating ionized components of the accelerated gas cluster ion beam from neutral components to form an accelerated and focused Neutral Beam.

3. The apparatus of claim 1, wherein the holding means further comprises positioning means for positioning a selected region of the workpiece in the trajectory of the Neutral Beam.

4. The apparatus of claim 1, wherein the holding means further comprises scanning means for scanning a selected region of the workpiece in the trajectory of the Neutral Beam.

5. The apparatus of claim 1, wherein the probe beam source is an ion beam source or an x-ray source.

6. The apparatus of claim 1, wherein the analytical sensor comprises an ion sensor, or and electron sensor, or a photon sensor.

7. The apparatus of claim 1, wherein the apparatus is a:
   SIMS depth profile analysis apparatus;
   XPS depth profile analysis apparatus; or
   ESCA depth profile analysis apparatus.

8. The apparatus of claim 1, wherein the Neutral Beam comprises neutral monomers selected from the group consisting of an inert gas, oxygen, carbon dioxide, nitrogen, ammonia, fluorine, and a condensable halogen-containing gas.

9. The apparatus of claim 1, wherein the workpiece material comprises a polymer, a dielectric, an electrically insulating material, a electrical resistivity material, a glass, or a ceramic.

10. The apparatus of claim 8, wherein inert gases include argon, and further wherein the condensable halogen-containing gas includes sulfur hexafluoride or tetrafluoromethane.

11. The apparatus of claim 9, wherein a dielectric, an electrically insulating material, and a electrical resistivity material includes a semiconductor, an oxide, a nitride, silicon, silicon dioxide, a glass or a ceramic.

12. The apparatus of claim 1, wherein the probe beam is derived from the gas cluster ion beam of the etching beam source.

13. The apparatus of claim 12, wherein the etching beam source includes means for selectively producing a neutral beam or a beam with ions.

14. The apparatus of claim 2, wherein the means for substantially fully dissociating gas cluster ions includes means for increasing the range of velocities of the gas cluster ions.

* * * * *